United States Patent

Feng

(10) Patent No.: US 7,122,459 B2
(45) Date of Patent: Oct. 17, 2006

(54) SEMICONDUCTOR WAFER PACKAGE AND MANUFACTURING METHOD THEREOF

(75) Inventor: Yao-Hsin Feng, Hualien (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 174 days.

(21) Appl. No.: 10/874,238

(22) Filed: Jun. 24, 2004

(65) Prior Publication Data

US 2004/0266162 A1 Dec. 30, 2004

(30) Foreign Application Priority Data

Jun. 30, 2003 (TW) ............... 92117889 A

(51) Int. Cl.
H01L 21/44 (2006.01)

(52) U.S. Cl. .............. 438/613; 257/E21.508

(58) Field of Classification Search ..... None
See application file for complete search history.

(56) References Cited

U.S. PATENT DOCUMENTS

| | | | |
|---|---|---|---|
| 6,054,171 A * | 4/2000 | Shoji ............ | 438/106 |
| 6,180,504 B1 * | 1/2001 | Farnworth et al. .......... | 438/612 |
| 6,187,615 B1 * | 2/2001 | Kim et al. ............ | 438/113 |
| 6,425,516 B1 * | 7/2002 | Iwatsu et al. .......... | 228/180.22 |
| 6,506,671 B1 * | 1/2003 | Grigg ............ | 438/612 |
| 6,569,753 B1 * | 5/2003 | Akram et al. ............ | 438/612 |
| 6,578,755 B1 * | 6/2003 | Elenius et al. ............ | 228/254 |
| 6,854,633 B1 * | 2/2005 | Grigg et al. ............ | 228/33 |
| 6,885,101 B1 * | 4/2005 | Storli ............ | 257/737 |
| 6,902,995 B1 * | 6/2005 | Grigg ............ | 438/612 |
| 2005/0082670 A1 * | 4/2005 | Quinones et al. ............ | 257/737 |
| 2006/0024863 A1 * | 2/2006 | Chung ............ | 438/107 |
| 2006/0038291 A1 * | 2/2006 | Chung et al. ............ | 257/738 |

* cited by examiner

Primary Examiner—David A. Zarneke
(74) Attorney, Agent, or Firm—Bacon & Thomas, PLLC

(57) ABSTRACT

A manufacturing method of a semiconductor wafer package mainly comprises the following steps. Firstly, a semiconductor wafer having a plurality of bonding pads and a passivation layer exposing the bonding pads is provided. Next, under bump metallurgy layers are formed on each of the bonding pads respectively. Then, a mask is formed above the semiconductor wafer to expose the under bump metallurgy layers through each of the openings of the mask. Afterwards, a plurality of bump structures are disposed separately in the openings wherein each of the bump structures has a bump and a reinforced layer covering the bump. Finally, a reflow step is performed so that each of the reflowed bumps is connected to the corresponding under bump metallurgy layer and the reinforced layers are transformed into bump-reinforced collars to cover the under bump metallurgy layers and encompass the bumps. In addition, a semiconductor wafer package, which is formed by the manufacturing method, is provided.

9 Claims, 5 Drawing Sheets

SEMICONDUCTOR WAFER PACKAGE AND MANUFACTURING METHOD THEREOF

BACKGROUND OF THE INVENTION

1. Field of Invention

This invention relates to a semiconductor wafer package. More particularly, the present invention is related to a semiconductor wafer package having a plurality of solder bumps encompassed by a plurality of bump-reinforced collars respectively and the manufacturing method thereof.

2. Related Art

In this information explosion age, integrated circuits products are used almost everywhere in our daily life. As fabricating technique continue to improve, electronic products having powerful fictions, personalized performance and a higher degree of complexity are produced. Nowadays, most electronic products are relatively light and have a compact body. Hence, in semiconductor production, various types of high-density semiconductor packages, for example ball grid array package (BGA), chip-scale package (CSP), multi-chips module package (MCM) and flip chip package (F/C), have been developed.

However, as mentioned above, flip chip is one of the most commonly used techniques for forming an integrated circuits package. Compared with a wire-bonding package or a tape automated bonding (TAB) package, a flip-chip package has a shorter electrical path on average and has a better overall electrical performance. In said flip-chip package, the bonding pads on a chip and the contacts on a substrate are connected together through a plurality of bumps formed by the method of bumping process. It should be noted that there is further an under bump metallurgy layer disposed on the bonding pads of the chip to be regarded as a connection medium for connecting to the bumps and enhancing the mechanical strength of the connection of the chip to the substrate after said chip is attached to the substrate.

Moreover, said manufacturing method of a semiconductor wafer package is usually utilized in flip chip technology. Therein, a plurality of under bump metallurgy layers are formed on the corresponding bonding pads of the wafer respectively, and a plurality of solder balls or bumps are mounted onto the under bump metallurgy layers so as to be regarded as interconnections for electrically and mechanically connecting the chip and the substrate when the chip is flip-chip bonded to the substrate.

Referring to FIG. 1, it illustrates a partially cross-sectional view of a conventional semiconductor wafer 100. Therein, the semiconductor wafer 100 has a plurality of bonding pads 102 and a passivation layer 104 exposing the bonding pads 102. Moreover, under bump metallurgy layers 106 are formed on the bonding pads 102 respectively. After a semiconductor wafer 100 as shown above is provided, a plurality of reinforced layers 108 are formed on the under bump metallurgy layers 106, preferably, said reinforced layers 108 are located over the bonding pads 102. Afterwards, a plurality of solder bumps or solder balls 109 are disposed on the reinforced layers 108. Generally speaking, the reinforced layers are made of a material comprising polyimide, Benzocyclobutene (BCB) and polymer materials.

Next, referring to FIG. 1 again and FIG. 2, when the solder bumps 109 are performed a reflow process, the reflowed solder bumps 110 are securely attached to the under bump metallurgy layers 106 and said reinforced layers 108 are melted to be transformed into a plurality of bump-reinforced collars 112 to cover the periphery of each solder bumps 110 as shown in FIG. 2.

In general, each of the under bump metallurgy layers 106 mainly comprises an adhesive layer, a barrier layer and a wetting layer. The adhesive layer is utilized to enhance the mechanical strength of the connection of the bonding pad 102 to the barrier layer, wherein the material of the adhesive layer is made of aluminum or titanium. The barrier layer is utilized to avoid the diffusion of the underlying metal, wherein the material of the barrier layer usually includes nickel-vanadium alloy, nickel-copper alloy and nickel. In addition, the wetting layer, for example a copper layer, is utilized to enhance the wettability of the solder bump 109 with the under bump metallurgy layer 106. It should be noted that the under bump metallurgy layers 106 are formed through the processes of placing photo-resist, proceeding plating or sputtering metal on the surface of the semiconductor wafer 100 and etching the metal.

As mentioned above, there is needed the bump-reinforced collar 112 with a thickness not less than first-six of the diameter or the height of the reflowed solder bump 110 to well cover the reflowed solder bump 110 and enhance the mechanical reliability of the reflowed solder bump 110. To be noted, each of the reinforced layers 108 is disposed on the corresponding bonding pad 102 through printing process by using photo-mask and stencil, accordingly, said reinforced layer 108 is not well and equally distributed on the under bump metallurgy layer 106. Moreover, the solder bumps 109 are directly placed on the reinforced layers 108 before the bumps 109 are reflowed; and then the reinforced layers 108 are melted to be transformed into bump-reinforced collars 112 to partially cover and encompass the reflowed solder bumps 110 to have the reflowed solder bumps 110 securely attached to the under bump metallurgy layers 106 by penetrating the reinforced layers 108 after reflowing the solder bumps 110. Thus, the portion of each of the reflowed solder bumps 110 not covered by the bump-reinforced collar 112—is not substantially the same with each other. Namely, the height of each reflowed solder bump 110 encompassed by the reinforced collar 112 is not substantially the same with each other, for example H1 is different from H2 as shown in FIG. 2.

Per the above disadvantages, it will lower the mechanical reliability of the semiconductor wafer package and the combination of said chip of the semiconductor wafer package and substrate. Therefore, providing another method for forming bumps to solve the mentioned-above disadvantages is the most important task in this invention.

SUMMARY OF THE INVENTION

In view of the above-mentioned problems, this invention is to provide a semiconductor wafer package having a plurality of reflowed bumps which are covered by the bump-reinforced collars respectively and the manufacturing method thereof.

To achieve these and other advantages and in accordance with the purpose of the invention, as embodied and broadly described herein, the invention provides a manufacturing method of a semiconductor wafer-package mainly comprising the following steps. Firstly, a semiconductor wafer is provided, wherein the semiconductor wafer has a plurality of bonding pads, a plurality of under bump metallurgy layers and a passivation layer exposing the under bump metallurgy layers located over the bonding pads. Next, a mask, such as a photo-resist layer or a photo-mask, is provided to cover the active surface of the semiconductor wafer and form a plurality of openings to expose the under bump metallurgy layers located over the bonding pads. Afterwards, a plurality of solder-bump structures are placed in the openings. To be noted, each solder-bump structure comprises a solder bump and a reinforced layer covering the solder bump. Finally, a reflow process is performed to melt the solder-bump structures to have the solder bumps transformed into reflowed solder bumps and attached to the under bump metallurgy layers and have the reinforced layer transformed into bump-reinforced collars to cover the reflowed solder bumps and the under bump metallurgy layers. And then the mask is removed to complete the semiconductor wafer package process to form a semiconductor wafer package.

Moreover, the invention also provides a semiconductor wafer package according to the above manufacturing method. Therein, the semiconductor wafer package mainly comprises a semiconductor wafer, a plurality of reflowed solder bumps disposed on the semiconductor wafer and a plurality of bump-reinforced collars covering the reflowed solder bumps, respectively, to at least expose the top of the reflowed solder bumps. Said semiconductor wafer has an active surface, a passivation layer located on the active surface, a plurality of bonding pads exposed out of the passiveation layer and a plurality of under bump metallurgy layers disposed on the bonding pads. In addition, the height of the portion of each reflowed solder bump not covered by the bump-reinforced collar is substantially the same with each other.

As mentioned above, the reinforced layer formed on and covering each solder bump to form a solder-bump structure is a thin reinforced layer, and said reinforced layer is well and equally distributed on each solder bump. Accordingly, when the solder-bump structures are reflowed to have the reinforced layer melted, there will be no melted reinforced layer disposed on the under bump metallurgy layers so as to easily transform the reinforced layer into a plurality of bump-reinforced collars to well cover the reflowed solder bumps. Thus, the height of the portion of each reflowed solder bump covered by the bump-reinforced collar 210 is substantially the same with each other, for example H3 and H4 as shown in FIG. 3 are substantially the same with each other, after said reflow process is performed.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
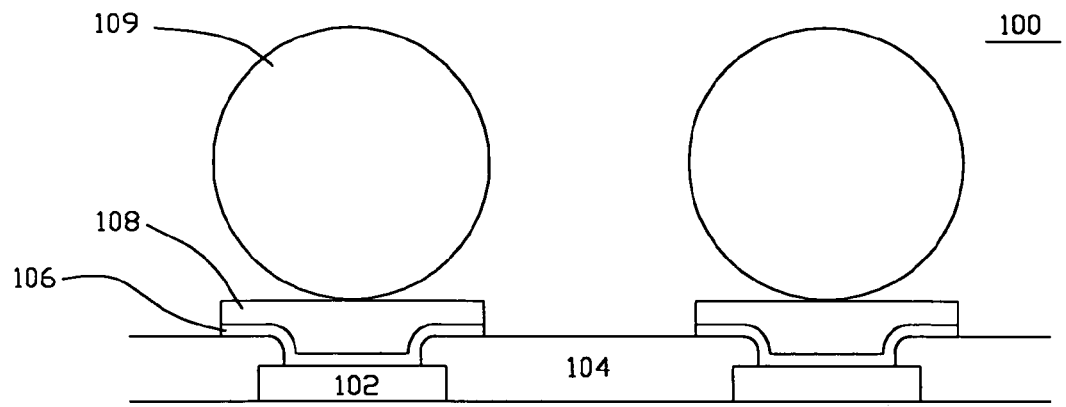
FIG. 1 and FIG. 2 are partially enlarged cross-sectional views showing the progression of steps for forming a conventional semiconductor wafer package.
Figure 2:
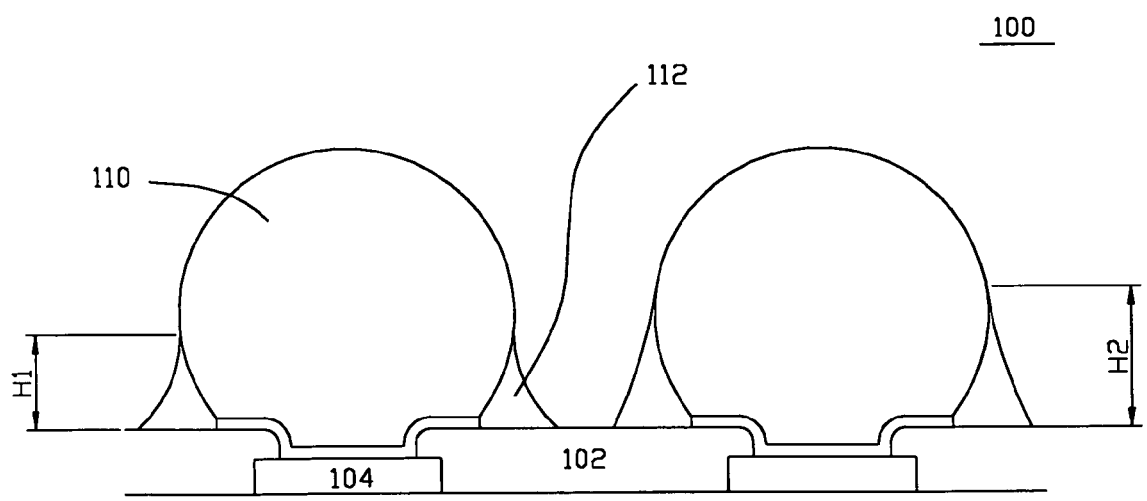

The semiconductor wafer package according to the preferred embodiment of this invention will be described herein below with reference to the accompanying drawings, wherein the same reference numbers are used in the drawings and the description to refer to the same or like parts.

Figure 3:
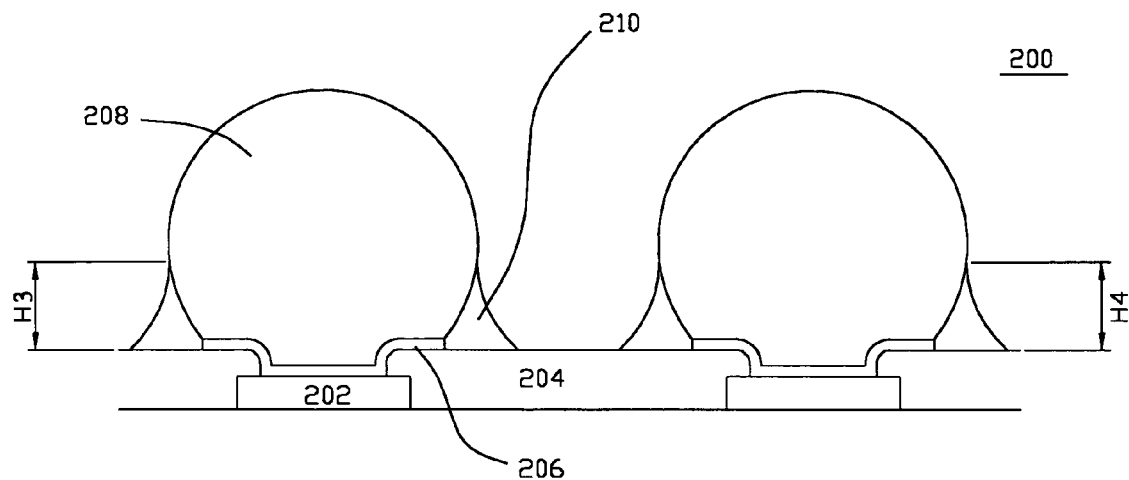
FIG. 3 illustrates a partially cross-sectional view of the semiconductor wafer package according to the preferred embodiment.

FIG. 3 is partially enlarged cross-sectional views showing the semiconductor wafer package according to the preferred embodiment.

Referring to FIG. 3 again, it shows the partially enlarged cross-sectional view of the semiconductor wafer 200. Therein, the semiconductor wafer 200 has bonding pads 202, a passivation layer 204 exposing the bonding pads 202 and a plurality of under bump metallurgy layers 206 formed on the bonding pads 202. Furthermore, a plurality of reflowed solder bumps 208 are formed on the under bump metallurgy layers 206. To be noted, the passivation layer 204 is provided to protect the active surface of the semiconductor wafer 200. Moreover, the reflowed solder bumps 208 are covered or encompassed by bump-reinforced collars 210. Therein, the top of each reflowed solder bump 208 is at least exposed out of the bump-reinforced collar 210. Generally speaking, the height of the portion of each reflowed solder bump 208 covering the bump-reinforced collar 210 shall not be more than fifth-six of the height of the reflowed solder bump 208. To be noted, the reinforced layer is a thin layer and is initially formed on and covers the solder bump to form solder-bump structure, the reinforced layer is well distributed on each solder bump. Accordingly, when the solder-bump structures with reinforced layer thereon are reflowed, the bump-reinforced collars transforming from the reinforced layers will well and equally distributed at the periphery of the corresponding reflowed solder bumps 208 to have the height of the portion of each reflowed solder bump 208 covered by the bump-reinforced collar 210 be substantially the same with each other.

Besides, each of the under bump metallurgy layers 206 generally comprises an adhesive layer, a barrier layer and a wetting layer. The adhesive layer is utilized to enhance the mechanical strength of the connection of the bonding pad 202 to the barrier layer, wherein the material of the adhesive layer is made of aluminum or titanium. The barrier layer is utilized to avoid the diffusion of the underlying metal, wherein the material of the barrier layer usually includes nickel-vanadium alloy, nickel-copper alloy and nickel. In addition, the wetting layer, for example a copper layer, is utilized to enhance the wettability of the reflowed solder bump 208 with the under bump metallurgy layer 206. It should be noted that the under bump metallurgy layers 206 are formed through the processes of placing photo-resist, proceeding plating or sputtering metal on the surface of the semiconductor wafer 200 and etching the metal Next, referring to the drawings shown from FIG. 4 to FIG. 7, these drawings illustrate partially enlarged cross-sectional views showing the progression of steps for forming a semiconductor wafer package according to the preferred embodiment of this invention.

Figure 4:
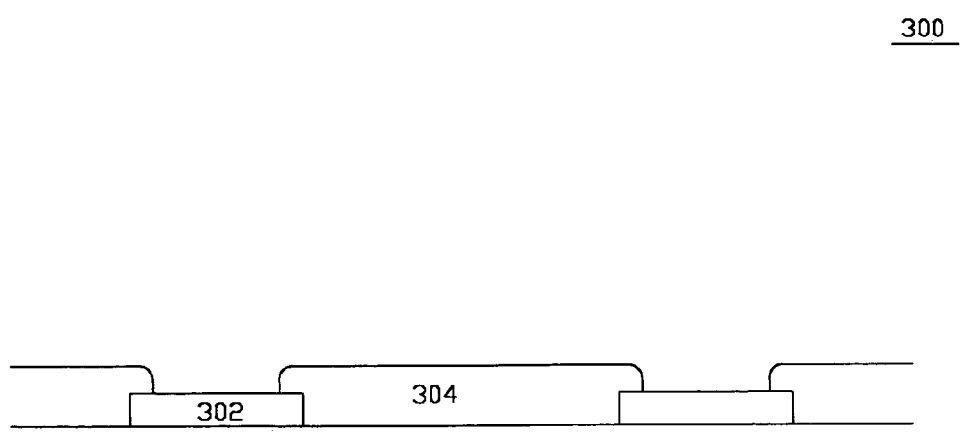
FIGS. 4 to 7 are partially enlarged cross-sectional views showing the progression of steps for forming a semiconductor wafer package according to the preferred embodiment of this invention.

Firstly, referring to FIG. 4, a semiconductor wafer 300 is provided, wherein the semiconductor wafer 300 has a plurality of bonding pads 302 and a passivation layer 304 disposed above the active surface of the semiconductor wafer 300 and exposing the bonding pads 302.

Figure 5:
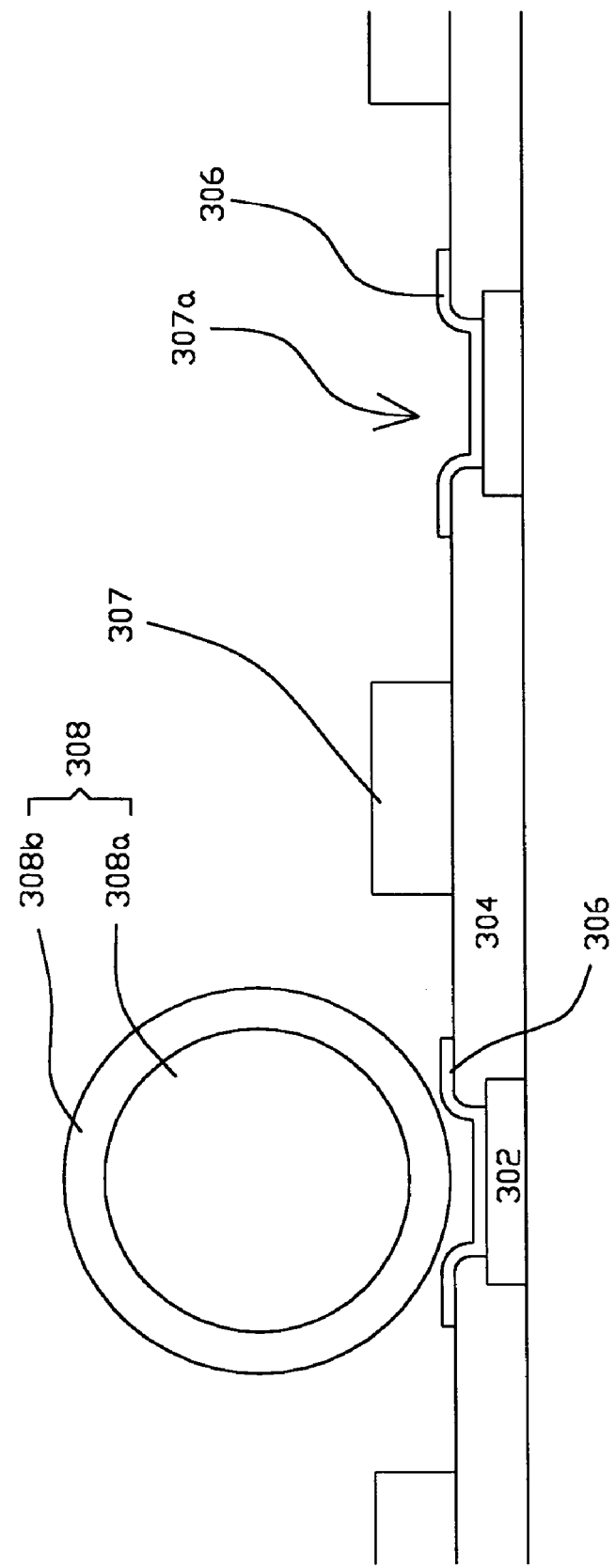

Next, referring to FIG. 5, under bump metallurgy layers 306 are formed over the active surface of the semiconductor wafer 300 to cover the bonding pads 302. Moreover, a mask 307 is formed above the semiconductor wafer 300 to form a plurality of openings 307a to expose the under bump metallurgy layers 306. Therein, the openings 307 expose the under bump metallurgy layers 306 located over the bonding pads 302. Then, a plurality of solder-bump structures 308 are disposed in the openings 307a. To be noted, each solder-bump structure 308 is made of a solder bump 308a and a reinforced layer 308b covering the solder bump 308a.

Figure 6:
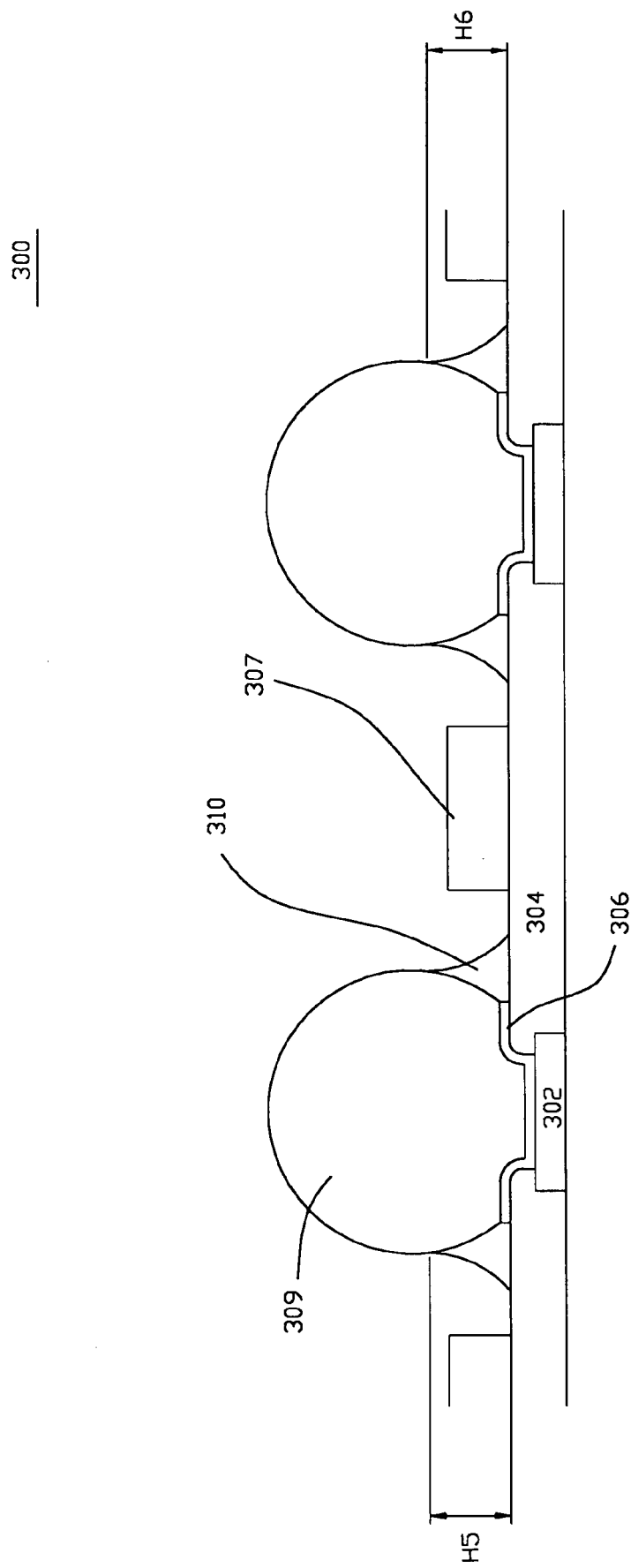

As mentioned above, referring to FIG. 5 again and FIG. 6, a reflow process is performed to melt the solder-bump structures 308 to have the reinforced layers 308b to be transformed into bump-reinforced collars 310 and have the solder bumps 308a melted into reflowed solder bumps 309 to be securely attached to the under bump metallurgy layers 306. To be noted, the bump-reinforced collars are made of a polymer material and cover the solder bumps 309 with a height of no more than first-six of the height of the reflowed solder bumps 309 to enhance the mechanical strength of the attachment of the reflowed solder bumps 309 to the under bump metallurgy layers 306.

Figure 7:
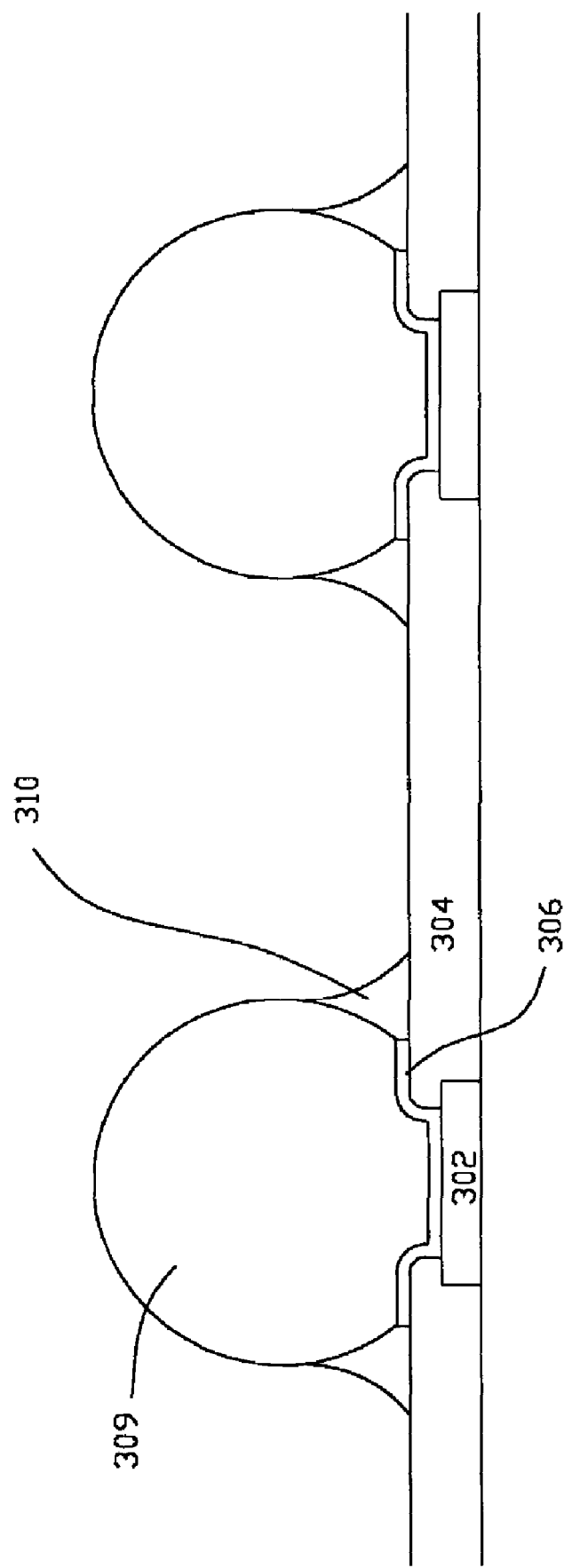

Besides, the reinforced layer 308b covering the surface of the solder bump 308a is thin so that that the reinforced layer 308b is distributed well and equally on the surface of the solder bump 308a. In such a manner, when the reinforced layer 308b is melted to be transformed into the bump-reinforced collar 310 to cover the relowed solder bump 309, the height of the portion of the reflowed solder bump 309 is substantially the same with the others. Namely, the heights of H5 and H6 as shown in FIG. 7 are substantially the same with each other.

To be continued and as specified in the above, when the under bump metallurgy layer is extended over the passivation layer to be regarded as a redistributed layer and a redistributed pad, said above-mentioned method shall also apply to the semiconductor wafer having redistributed layers and redistributed pads.

As mentioned above, the reinforced layer formed on and covering each solder bump as a solder-bump structure is a thin reinforced layer and said reinforced layer is well and equally distributed on each solder bump. Accordingly, when the solder-bump structures are reflowed to have the reinforced layer melted, there will be no melted reinforced layer disposed on the under bump metallurgy layers so as to easily transform the reinforced layer into a plurality of bump-reinforced collars to well cover the reflowed solder bumps. Thus, the height of the portion of each solder bump covered by the reinforced layer is substantially the same with each other, after said reflow process is performed.

Although the invention has been described in considerable detail with reference to certain preferred embodiments, it will be appreciated and understood that various changes and modifications may be made without departing from the spirit and scope of the invention as defined in the appended claims.

What is claimed is:

1. A manufacturing method of a semiconductor wafer package, comprising:

providing a semiconductor wafer having a plurality of bonding pads and a passivation layer exposing the bonding pads;

forming a plurality of under bump metallurgy layers on the bonding pads;

disposing a mask above the semiconductor wafer to form a plurality of openings wherein the openings expose the under bump metallurgy layers located over the bonding pads;

disposing bump structures in the openings, wherein each said bump structure has a bump and a reinforced layer covering the bump;

performing a reflow process to have the bumps transformed into reflowed bumps to be attached to the under bump metallurgy layers and have the reinforced layers transformed into bump-reinforced collars to cover the under bump metallurgy layers and the reflowed bumps; and removing the mask.

2. The method of claim 1, wherein the mask comprises a photo-resist layer.

3. The method of claim 1, wherein the mask is a dry film.

4. The method of claim 1, wherein the bump is solder bump.

5. The method of claim 1, wherein the reinforced layer is made of a polymer material.

6. The method of claim 1, wherein the passivation layer is made of a material selected from silicon nitride, phosphosilicate glass and silicon oxide.

7. The method of claim 1, wherein one of the under bump metallurgy layers comprises a titanium layer, a nickel-vanadium layer and a copper layer.

8. The method of claim 1, wherein the each bump-reinforced collar covers the each under bump metallurgy layer and the each reflowed bump.

9. The method of claim 1, wherein the each reflowed bump is exposed out of the each bump-reinforced collar with an exposed portion and the height of the exposed portion of the each reflowed bump is the same with each other.

* * * * *